(12) United States Patent
Yamaji et al.

(10) Patent No.: US 6,569,513 B2
(45) Date of Patent: May 27, 2003

(54) PREPREG AND PROCESS FOR MANUFACTURING SAME

(75) Inventors: Takashi Yamaji, Tokyo (JP); Mamoru Komatsu, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/984,207

(22) Filed: Oct. 29, 2001

(65) Prior Publication Data

US 2002/0168504 A1 Nov. 14, 2002

(30) Foreign Application Priority Data

Mar. 13, 2001 (JP) .................................... 2001-070122

(51) Int. Cl.⁷ ................................................. B32B 3/00
(52) U.S. Cl. ........................ 428/209; 428/304; 428/901
(58) Field of Search ................................ 428/209, 901, 428/304

(56) References Cited

U.S. PATENT DOCUMENTS

| | | | | |
|---|---|---|---|---|
| 4,434,023 A | * | 2/1984 | Kanamori et al. | 156/307.3 |
| 4,670,080 A | * | 6/1987 | Schwarz et al. | 156/307.5 |
| 5,236,777 A | * | 8/1993 | Inoguchi et al. | 428/268 |
| 5,281,441 A | * | 1/1994 | Kasai et al. | 427/300 |
| 5,382,333 A | * | 1/1995 | Ando et al. | 204/130 |

FOREIGN PATENT DOCUMENTS

| | | |
|---|---|---|
| JP | 54-142576 | 11/1979 |
| JP | 63-168438 | 7/1988 |
| JP | 4-119836 | 4/1992 |

* cited by examiner

*Primary Examiner*—Cathy Lam
(74) *Attorney, Agent, or Firm*—Oblon, Spivak, McClelland, Maier & Neustadt, P.C.

(57) ABSTRACT

A prepreg exhibiting excellent formability and producing laminated boards and multiple layer circuit boards exhibiting high thickness precision is disclosed. The prepreg comprises an inner layer made from a glass fiber substrate, having a weight of 40 g or more and less than 115 g per square meter and an air permeability or 20 $cm^3/cm^2$/sec or less, impregnated with an epoxy resin, and an outer layer of an epoxy resin coating provided on at least one side of the inner layer, wherein the epoxy resin reaction rate in the inner layer is 85% or more and the epoxy resin reaction rate in the outer layer is 60% or less.

19 Claims, 1 Drawing Sheet

PREPREG AND PROCESS FOR MANUFACTURING SAME

TECHNICAL FIELD

The present invention relates to a prepreg having high thickness precision and exhibiting excellent formability, and a method of manufacturing the prepreg. Particularly, the present invention relates to a prepreg through which via-holes can be bored by laser processing, and a process for manufacturing the prepreg. The prepreg of the present invention can be suitably used for preparing substrates for cellular phones, personal computers, Rambus memories, PDAs, and the like for which high-frequency characteristics are required.

BACKGROUND ART

Recently, as higher frequencies than before are used for laminated sheets for circuit boards and multiple-layer circuit boards, the requirements for the properties of the materials used for such boards have become more stringent. Materials for circuit boards have conventionally been studied, particularly with respect to circuit signal delays. Resins capable of controlling impedance through a reduction in the dielectric constant of circuit boards and the increase in the thickness precision of the substrates after fabrication have been developed. The thickness precision of a substrate correlates with signal delays, and the square root of the dielectric constant correlates with the signal delays. Therefore, increasing the thickness precision of a substrate is an important subject. It has been difficult to provide conventional prepregs with high substrate thickness precision due to flow out of the resins impregnated and cured in glass fiber during press fabrication. Only poor substrate thickness precision can be achieved if the newest type press facility is not used. In addition, resin powder readily falls from prepregs when the prepregs are cut or bent during handling. Such a resin powder adheres to copper foils and causes circuit defects.

Methods for improving the substrate thickness precision have been disclosed in Japanese Patent Applications Laid-open No. 123875/1978, No. 142576/1979, No. 168438/1988, and No. 119836/1992. Japanese Patent Applications Laid-open No. 123875//1978, No. 142576/1979, and No. 119836/1992 disclose prepregs containing a completely cured resin layer and a partly cured resin layer. The dimensional stability of laminated boards has been improved by using these methods. However, these methods have a problem of peel-off of the resin layers at the interface of a completely cured resin layer and a partly cured resin layer. Japanese Patent Application Laid-open No. 168438/1988 discloses a prepreg composed of resin layers having a different reaction rate. This method provides only insufficient improvement in the dimensional stability when applied to the fabrication of laminated boards. In addition, the method may cause migration of voids in the inner cloth, resulting in impaired long-term reliability.

A method of improving the problem of resin powder production from prepregs when bending the substrates has been disclosed in Japanese Patent Publication 334/1994. The Japanese Patent Publication 334/1994 proposes a method of melting the parts from which resin powder may readily fall out or the parts to which the resin powder has become attached. Although this method can prevent production of resin powder from prepregs, the method has problems such as denaturing of epoxy resin due to melting, requirement of investment for equipment, and an increase in the number of process steps.

Therefore, an object of the present invention is to provide a prepreg having high thickness precision, free from production of resin powder by bending and the like, free from voids in the inner layers, free from flow out, and exhibiting excellent formability, and a process for manufacturing such a prepreg.

DISCLOSURE OF THE INVENTION

In view of this situation, the inventors of the present invention have conducted extensive studies and have found that a prepreg having high thickness precision, free from production of resin powder by bending and the like, free from voids in the inner layers, free from flow out, and exhibiting excellent formability can be obtained by fabricating a prepreg comprising an inner layer consisting of a specific glass fiber substrate impregnated with an epoxy resin and an outer layer of an epoxy resin coating provided on at least one side of the inner layer, wherein the epoxy resin reaction rate in the inner layer is 85% or more and the epoxy resin reaction rate in the outer layer is 60% or less. These findings have led to the completion of the present invention.

Specifically, the present invention provides a prepreg comprising an inner layer made from a glass fiber substrate, having a weight of 40 g or more and less than 115 g per square meter and an air permeability of 20 $cm^3/cm^2/sec$ or less, impregnated with an epoxy resin, and an outer layer of an epoxy resin coating provided on at least one side of the inner layer, wherein the epoxy resin reaction rate in the inner layer is 85% or more and the epoxy resin reaction rate in the outer layer is 60% or less.

The present invention further provides a process of manufacturing a prepreg comprising (a) a step of impregnating a glass fiber substrate, having a weight of 40 g or more and less than 115 g per square meter and an air permeability of 20 $cm^3/cm^2/sec$ or less, with a solvent, (b) a step of impregnating the solvent-impregnated glass fiber substrate with epoxy resin, (c) a step of heating the epoxy resin-impregnated glass fiber substrate, (d) a step of further impregnating the epoxy resin-impregnated glass fiber substrate, in which the epoxy resin has been cured, with the epoxy resin, and (e) a step of heating the lastly obtained epoxy resin-impregnated glass fiber substrate, wherein the epoxy resin reaction rate in the inner layer is 85% or more and the epoxy resin reaction rate in the outer layer is 60% or less.

DETAILED DESCRIPTION

Figure 1:
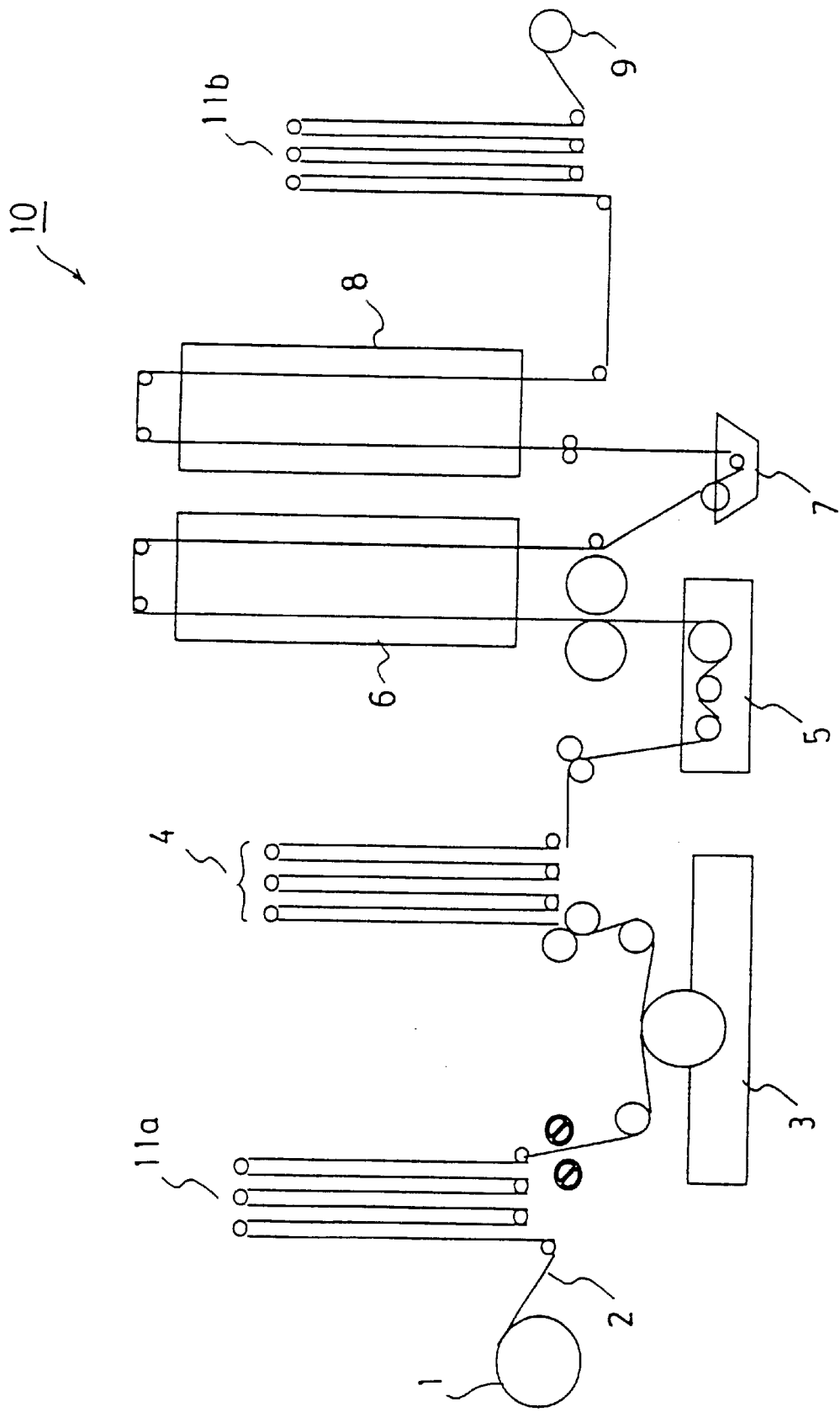
FIG. 1 is a flow diagram showing process steps for manufacturing the prepreg of an embodiment of the present invention.

The glass fiber substrate used for the prepreg of the present invention has a weight of 40 g or more and less than 115 g per square meter and an air permeability of 20 $cm^3/cm^2/sec$ or less. Such a glass fiber substrate ensures increased impregnation of the epoxy resin used for the inner layer and results in an inner layer substantially free from voids (hereafter may be called "voidless"). Usually, voids remaining in the inner layer made from a glass fiber substrate and an epoxy resin by impregnation and curing are removed during a forming operation such as a press forming operation. However, the voids may not be completely removed by the press forming operation. The remaining voids may impair long-term reliability which is verified by a migration test or the like. Because the reaction rate of the inner layer epoxy resin is maintained at 85% or more in the prepreg of the present invention, the epoxy resin has a high molten state viscosity and, therefore, almost no voids can be removed during the heat forming. Therefore, the inner layer must be made voidless prior to press forming.

If the glass fiber substrate used for the inner layer has air permeability of more than 20 $cm^3/cm^2/sec$, threads forming the glass fiber substrate are not thoroughly spread out, not only making it difficult for the glass fiber to be impregnated with the resin varnish, but also resulting in easy formation of strand voids. If the weight of the glass fiber substrate is less than 40 g per square meter, formation of the prepreg becomes difficult; if more than 115 g per square meter, on the other hand, impregnation of resins is not improved, even if the requirement for the air permeability of 20 $cm^3/cm^2/sec$ or less of the glass fiber substrate is satisfied. A glass fiber substrate having a weight of 47 to 105 g per square meter and an air permeability of 5 to 10 $cm^3/cm^2/sec$ is preferable. If the air permeability is less than 10 $cm^3/cm^2/sec$, a reduction of the time required for impregnation can be expected, affording higher productivity. Moreover, because a glass fiber substrate having the air permeability of 10 $cm^3/cm^2/sec$ or less has loose threads, the resulting prepreg can be fabricated using a laser beam. Known glass fabrics may be used as a glass fiber substrate for the prepreg.

The greater the value for the air permeability, the larger the clearance between the fibers and the greater the amount of air at a certain pressure allowed to flow from the surface to the back. On the other hand, the smaller the value for the air permeability, the smaller the clearance between the fibers and the smaller the amount of air at a certain pressure allowed to flow through the substrate. The air permeability can be measured according to the method conforming to JIS R3420. A conventionally known thread opening treatment may be carried out to make the air permeability of a glass fiber substrate within the above range. Furthermore, a convergent agent should preferably be removed from the glass fiber substrate used in the present invention by a suitable treatment. Such a treatment can further increase epoxy resin impregnation in the inner layer, ensuring manufacture of voidless prepregs. The thread opening treatment used in this specification means a treatment using a high pressure water jet or the like to loosen warp yarn and weft yarn forming the glass fiber substrate and expand the width between them. The convergent agent removing treatment is a treatment to remove binders, glue materials, and the like conventionally used when a glass fiber substrate is woven and to reduce the content of these materials to a certain level, e.g. to less than 0.1 wt %.

There are no specific limitations to the epoxy resin used for the inner layer and the outer layer in the present invention. Bisphenol epoxy resins, novolak epoxy resins, and the like can be given as examples. Additives such as a curing agent, curing catalyst, filler, surfactant, silane coupling agent, and the like can be optionally added to the epoxy resin of the present invention. Usually, the epoxy resin is used in the form of a varnish formed by dissolving the epoxy resin in a solvent which preferably has a good solubility with the resin. A poor solvent may also be used to the extent that there is no adverse effect. Either the same varnish or different varnishes can be used for the inner layer and the outer layer.

In the present invention, the reaction rate of the epoxy resin in the inner layer is 85% or more and that of the outer layer is 60% or less. The object of the present invention of improving the substrate thickness precision and preventing production of resin powder can be attained by using the above-mentioned specific glass fiber substrate and forming the inner layer and outer layer from epoxy resins having the defined reaction rates. If the reaction rate of the epoxy resin in the inner layer is less than 85%, an increased amount of resin flows out during heat forming, resulting in impaired thickness precision. On the other hand, if the reaction rate of the epoxy resin in the outer layer is more than 60%, adhesion with the other layers may become insufficient when used for multi-layer boards, such as copper-clad laminates and multiple-layer printed circuit boards, resulting in inadequate formability such as insufficient embedding of resins in circuits. Because the inner layer epoxy resin in the present invention has been cured to a more advanced degree, the prepreg exhibits only lower fluidity and less adhesion if the inner layer alone is provided. However, the provision of the outer layer epoxy resin having the reaction rate of 60% or less can sufficiently achieve the object of embedding of resin in the inner layer circuits and adhesion with other layers in the case of multiple-layer boards.

More preferably, the reaction rate of the inner layer epoxy resin is 90 to 95% and that of the outer layer epoxy resin is 0 to 20%; with particularly preferable reaction rates for the inner layer and outer layer being respectively 90 to 95% and 0 to 20%. If the reaction rates are within the above preferable range, not only can the thickness precision be increased and resin powder production be prevented, but also flow out of the resin can be prevented and formability can be improved. In addition, if the reaction rate of the outer layer epoxy resin is 0 to 20%, embedding of the resin in the inner layer circuits in the case of multiple-layer boards can be improved, saving the amount of resin required for embedding or the amount of flowing resin. This results in increased thickness precision. In a prepreg in which the reaction rate of the inner layer epoxy resin is not as high as required in the present invention or in a single layer prepreg with the reaction rate of 20% or less, flow out of resin increases and the substrate thickness precision is impaired.

The reaction rate in the present invention can be determined by differential scanning calorimetry (DSC). Specifically, the reaction rate can be determined by applying the exothermic peak areas due to the DSC reaction of both the unreacted resin and the resin in each layer to the following formula (2). The measurement may be carried out in a nitrogen atmosphere at a temperature rise of 10° C./minute.

Reaction rate (%)={1−(reaction peak area of resin)/(reaction peak area of unreacted resin)}×100  (2)

Although the reaction rate can be controlled by various methods such as adjustment of the heating temperature, heating time, irradiation of lights and electron beams, and the like, control by means of the heating temperature and heating time is easy and brings about a good result.

The weight ratio (R)/(G) of the epoxy resin (R) and the glass fiber substrate (G) in the inner layer of the present invention is 0.43 or more, and preferably from 0.53 to 2.40. Specifically, the amount of epoxy resin should preferably be 43 parts by weight or more for 100 parts by weight of the glass fiber substrate. If the amount of epoxy resin is less than 43 parts by weight, impregnation of the resin in the glass fiber substrate is incomplete, giving rise to a risk of leaving strand voids. If such an inner layer is dried and cured, and an outer layer is coated over the inner layer, voids in the cloth cannot be sufficiently removed. The reliability of the formed laminated boards may be impaired.

The prepreg of the present invention can be preferably used for multiple-layer boards such as copper-clad laminated boards and multiple-layer print circuit boards. When the prepreg is used for insulating the circuit layers in multiple-layer print circuit boards, the weight of the epoxy resin per unit area in each outer layer should preferably be greater than the value A determined by the following formula and less than 1.5A.

$$A=(1-b/10^2) \times c/10^4 \times d \quad (1)$$

wherein A is the weight of the resin per unit area of the outer layer (g/cm$^2$), b is the amount of residual copper (%) in a circuit layer facing the outer layer of the prepreg, c indicates the thickness ($\mu$m) of the circuit copper foil, and d is the specific gravity (g/cm$^3$) of the outer layer resin.

If the weight of epoxy resin per unit area in the outer layer is less than the value A, the amount of resin in the outer layer is insufficient so that embedding of the circuits tends to be inadequate; if greater than 1.5A, on the other hand, the amount of resin in the outer layer is excessive, resulting in an increased flow-out amount during a forming operation, which gives rise to impaired thickness precision. The effect on flow-out in different circuits having the same copper residual rate differs according to the circuit patterns. Therefore, the amount of resin can be suitably determined in the above range. A preferable range for the weight of epoxy resin per unit area in the outer layer is between 1.1A to 1.4A. The residual copper rate (%) indicates the percentage of the circuit area formed in the inner circuit layer of a multiple-layer board.

When coating and impregnating the outer layer resin on both sides of the inner layer, the amount of epoxy resin applied to the different side of the inner layer may not be identical. For example, when copper foil surfaces on which an outer layer is provided have different copper residual rates, the thickness of the outer layer may be controlled according to the copper residual rate. Specifically, the amount of resin applied to the surface with a high copper residual rate may be smaller than the amount of resin applied to the surface with a low copper residual rate. Providing different amounts of resin to the different sides of the outer layer ensures reduction of the flow-out amount. When joining the prepreg of the present invention with a copper foil, the amount of resin in the outer layer can be determined according to the amount required for filling fine microscopic pits on the roughened copper foil surface. To produce the two outer layers each having a different amount of epoxy resin, the glass fiber substrate may be passed through the one side of a resin amount-controlling device which removes a larger amount of resin from that side than from the other side.

Either one sheet alone or a combination of two or more sheets of the prepreg of the present invention may be formed into a laminated board. Specifically, a circuit board or a multiple-layer circuit board can be obtained by laminating the prepreg with a metal foil and inner layer circuit board and by press-forming with heating. The use of the prepreg of the present invention with an inner layer circuit board brings about a greater thickness precision effect than use of the conventional prepregs. When using conventional prepregs, the amount of resin must be increased or the viscosity of the resin must be decreased to improve the circuit embedding effect. This results in an increase in the resin flow and impairs the board thickness precision. When the prepreg of the present invention is used, the amount of resin required for embedding the circuit can be adjusted according to the circuit configuration of the inner layer circuit board and the resin flow can be minimized.

The prepreg of the present invention can be manufactured by a process comprising (a) a step of impregnating a glass fiber substrate, having a weight of 40 g or more and less than 115 g per square meter and an air permeability of 20 cm$^3$/cm$^2$/sec or less, with a solvent, (b) a step of impregnating the solvent-impregnated glass fiber substrate with epoxy resin, (c) a step of heating the epoxy resin-impregnated glass fiber substrate, (d) a step of further impregnating the epoxy resin-impregnated glass fiber substrate, in which the epoxy resin has been cured, with the epoxy resin, and (e) a step of heating the last-obtained epoxy resin-impregnated glass fiber substrate, wherein the epoxy resin reaction rate in the inner layer is 85% or more and the epoxy resin reaction rate in the outer layer is 60% or less.

The process for manufacturing the prepreg of the present invention will now be explained referring to FIG. 1. FIG. 1 is a flow diagram for explaining the process for manufacturing the prepreg of this embodiment. In the Figure, the prepreg manufacturing device 10 comprises an unwinder 1 which unwinds a glass fiber substrate, a first accumulator 11a, a solvent impregnation apparatus 3, a solvent impregnation region 4, a first resin varnish impregnation apparatus 5, a first drier 6, a second resin varnish impregnation apparatus 7, a second drier 8, a second accumulator 11b, and a winder 9. These apparatuses are arranged in that order from the upstream to downstream. In addition, resin amount-controlling equipment, not shown in the Figure, may be provided.

The step (a) comprises unwinding glass fiber substrate 2 from the unwinder 1 and impregnating the glass fiber substrate 2 with a solvent to decrease voids in the target prepreg. The same glass fiber substrate as mentioned above can be used as the glass fiber substrate 2. As a solvent, dimethyl formamide (DMF), methyl cellosolve (MCS), methyl ethyl ketone (MEK), and the like can be given. Of these solvents, DMF is preferably used due to easy control in the manufacturing process, excellent impregnation in the glass fiber substrate 2, and easy replacement with an epoxy resin in the later step. The time required for impregnating the glass fiber substrate 2 with the solvent at this step is preferably 0.1 to 1 minute, and more preferably 0.1 to 0.5 minute at room temperature. If the impregnation time is less than 0.1 minute, impregnation of solvent becomes insufficient. An impregnation time longer than one minute requires a large and complicated facility for the solvent impregnation, giving rise to increased production cost. Dip coating, kiss coating, and the like can be given as a method for impregnating the glass fiber substrate with a solvent.

After the solvent impregnation according to the step (a) and before impregnation of the inner layer with the epoxy resin according to the step (b), the substrate is preferably passed through an air stream for 1 to 5 minutes at a temperature lower than the boiling point of the solvent used in the solvent impregnation according to the step (a), preferably at least 50° C. lower than the boiling point of the solvent used in the solvent impregnation according to the step (a). This procedure helps the solvent to homogeneously spread all over the glass fiber and ensures a voidless inner layer. After this substrate is passed through the air stream, an excess amount of solvent is removed by a collecting rod or the like so that the amount immediately before the step (b) becomes 16 to 25 parts by weight per 100 parts by weight of the glass fiber substrate. If there is an excess amount of solvent, the excessive solvent is carried over to the resin varnish used in the step (b), making it necessary to remove the excessive solvent in the drying operation in the step (c). This accompanies undesirable problems such as easy production of voids and the like.

In the step (b), the solvent-impregnated glass fiber substrate 2 obtained in the step (a) is passed through the first resin varnish impregnation apparatus 5 to impregnate the glass fiber substrate 2 with an epoxy resin. Examples of epoxy resins used in the step (b) include, but are not limited to, bisphenol epoxy resins and novolak epoxy resins. The epoxy resin is used in the form of a varnish formed by dissolving the epoxy resin in a solvent which preferably has good solubility with the resin. A poor solvent may also be used to the extent there is no adverse effect. Additives such as a curing agent, curing catalyst, filler, surfactant, silane coupling agent, and the like can be optionally added. The time required for impregnating the glass fiber substrate 2 with the epoxy resin is preferably 0.1 to 1 minute, and more preferably 0.1 to 0.5 minute at room temperature. If the impregnation time is less than 0.1 minute, impregnation of the resin in the width direction may not be homogeneous. An impregnation time longer than one minute requires a large and complicated facility for the varnish impregnation, giving rise to increased production cost.

The step (c) is a step of heating the glass fiber substrate 2 impregnated with the epoxy resin in a first drier 6 to form an epoxy resin layer which has reacted to a certain extent. In this step, voids remaining in the cloth are removed by replacing the solvent with the varnish and by heating. This procedure increases the reaction rate of the epoxy resin in the inner layer to 85% or more and makes the inner layer voidless, thereby improving the thickness precision of the resulting prepreg and preventing production of resin powder. The heating conditions are preferably 140 to 200° C. for 1 to 5 minutes. If the heating temperature is lower than 140° C., it takes too long for the reaction rate to reach 85%, requiring large scale production facilities. If the temperature is higher than 200° C., the epoxy resin may be denatured, giving rise to impaired properties of the resulting laminated products, particularly in terms of heat-resistance and water-absorption resistance. If the heating time is less than one minute, voids may remain in the inner layer; if the heating time is longer than five minutes, large production facilities may be required. In view of compatibility of the productivity and voids removal, desirable heating conditions are heating temperatures of 160 to 180° C. and heating times of 1 to 4 minutes. The reaction rate of 85% or more of the epoxy resin in the inner layer may not necessarily be achieved in this step (c). It is sufficient that this target is ultimately attained in the prepreg after the later-described step (e).

In the step (d), the epoxy resin-impregnated glass fiber substrate 2 is passed through the second resin varnish impregnation apparatus 7 for further impregnation of the epoxy resin, whereby an outer epoxy resin layer is formed on at least one side of the inner layer. The further epoxy resin impregnation after the above-mentioned step (c) according to the present invention ensures the configuration comprising an inner layer in which the reaction has proceeded to a certain extent and an outer layer on at least one side of the inner layer. There are no specific limitations to the epoxy resin used for the outer layer. Bisphenol epoxy resins, novolak epoxy resins, and the like can be given as examples. The time required for impregnating the epoxy resin-impregnated glass fiber substrate with an epoxy resin in this step (d) is preferably 0.1 to 1 minute at room temperature. If the impregnation time is less than 0.1 minute, the resin may not be impregnated in the width direction. An impregnation time longer than one minute requires a large and complicated facility for varnish impregnation so that production is hindered. The time in which the varnish is impregnated is preferably from 0.1 to 0.5 minute in view of productivity. The amount of resin can be controlled by the resin amount control equipment, such as a squeeze roll, a comma knife, or the like. Specifically, the resin amount can be controlled by the gap of the resin amount control equipment and passage position of the glass fiber substrate 2. For example, a prepreg with an equivalent outer layer resin amount on both sides can be obtained by passing the glass fiber substrate 2 through the middle of the gap of the resin amount control equipment.

The step (e) consists of heating the glass fiber substrate 2 impregnated with the epoxy resin in a second drier 8 to form an outer epoxy resin layer. The reaction rate of epoxy resin in the inner layer and the outer layer is also adjusted in this step. The heating conditions are preferably 140 to 200° C. for 1 to 5 minutes. If the temperature is lower than 140° C., the productivity is poor; if higher than 200° C., the curing reaction may proceed unnecessarily and the epoxy resin may be denatured, giving rise to impaired properties of the resulting laminated products, particularly in terms of heat-resistance and water-absorption resistance. If the heating time is less than one minute, the degree of curing in the width direction may become uneven, making it difficult to produce prepregs. Heating time in excess of five minutes requires large facilities. From the viewpoint of the productivity, desirable heating conditions are a heating temperature of 160 to 200° C. and a heating time of 1 to 4 minutes.

The reaction rate of the epoxy resin in the inner layer and the outer layer in the prepreg of the present invention is respectively brought to 85% or more and 60% or less by performing the above steps (a) to (e) in that order. A prepreg with a different reaction rate in the inner layer and the outer layer can be formed by suitably selecting the heating conditions of the step (c) and the step (e). The prepreg obtained is sent to the second accumulator 11b, and continuously wound by the winder 9 or cut to a prescribed length by a cutter, not shown in the figure. Specifically, the prepreg prepared in this embodiment can be cut into an appropriate length, laminated with a metal foil, an inner layer circuit board, and the like, and fabricated into circuit boards or multiple-layer circuit boards by press-forming with heating. Alternatively, the long prepreg may be wound as is and fabricated into circuit boards or multiple-layer circuit boards by continuously laminating with a metal foil such as a copper foil, aluminium foil, or nickel foil, an inner layer circuit board, and the like.

EXAMPLES

The present invention will be described in more detail by examples, which should not be construed as limiting the present invention.

Example 1

Using a prepreg manufacturing apparatus shown in FIG. 1, a prepreg consisting of an inner layer and an outer layer was prepared. The inner layer consisted of an epoxy resin-impregnated glass fiber substrate, both sides of which have been coated with an epoxy resin outer layer.

Fiber Opening Processing of Glass Fabric

A commercially available glass fabric having a weight of 104 g per square meter was subjected to a known fiber opening process to loosen warp yarn and weft yarn. A glass fabric with a thickness of 0.1 mm and an air permeability of 10 $cm^3/cm^2$/sec was obtained. The air permeability was determined by the method described above.

Preparation of Epoxy Resin Varnish (I)

70 parts by weight of a bisphenol A epoxy resin with an epoxy equivalent of about 450 and 30 parts by weight of a phenol novolak epoxy resin with an epoxy equivalent of about 190 were dissolved in 100 parts by weight of methyl ethyl ketone. To this solution, a solution of 3 parts by weight of dicyandiamide and 0.15 parts by weight of 2-phenyl-4-methylimidazole dissolved in 20 parts by weight of dimethylformamide was added. The mixture was stirred to obtain an epoxy resin varnish (I) for glass fabric.

Preparation of Epoxy Resin Varnish (II)

35 parts by weight of a bisphenol A epoxy resin with an epoxy equivalent of about 450, 35 parts by weight of a bisphenol A epoxy resin with an epoxy equivalent of about 2000, and 30 parts by weight of an o-cresol novolak epoxy resin with an epoxy equivalent of about 210 were dissolved in 100 parts by weight of methyl ethyl ketone. This solution was mixed with a solution of 3 parts by weight of dicyandiamide and 0.15 parts by weight of 2-phenyl-4-methylimidazole in 20 parts by weight of dimethylformamide to obtain an epoxy resin varnish (II).

Preparation of Prepreg

Step (a)–Step(c)

The glass fabric reeled out from the unwinder 1 was passed through the solvent impregnation apparatus 3, where glass fabric was impregnated with DMF solvent (step (a)), and was passed through an air stream at 25° C. for 3.5 minutes. The solvent-impregnated glass fabric was then passed through the first resin varnish impregnation apparatus 5 containing an epoxy resin varnish (I) to impregnate 100 parts by weight of the glass fabric with 64 parts by weight of the resin on the solid basis (step (b)). The product from step (b) was dried for 3 minutes in the first drier 6 at 170° C., to prepare an inner layer a consisting of a glass fabric impregnated with the epoxy resin (step (c)).

Step (d)–Step (e)

The epoxy-impregnated glass fabric obtained in the step (c) was passed through the second resin varnish impregnation apparatus 7 containing the epoxy resin varnish (I) to impregnate 100 parts by weight of the glass fabric with 110 parts by weight of the resin (including the weight of inner layer resin) on the solid basis (step (d)), followed by drying for 1.5 minutes in a drier at 170° C. to form an outer layer b (step (e)). A prepreg consisting of an inner layer a and an outer layer b formed on both sides of the inner layer was obtained in this manner.

Confirmation of Reaction Rate

An inner layer, obtained by impregnating the glass fabric with the epoxy resin varnish (I) and drying in a drier at 170° C. for 4.5 minutes as mentioned above, was used as a sample for the inner layer a. The sample for the outer layer b was prepared by cutting the surface of the prepreg consisting of the inner layer a and the outer layer b obtained above. A heat generation peak in samples for each layer was determined by DSC apparatus (manufactured by TA Instrument Co.). The heat generation peak areas due to the curing reaction at about 160° C. for the resin before the reaction and the resin for each layer were compared, and the reaction rate was calculated from the above formula (2). As a result, the reaction rates for the inner layer a and the outer layer b were confirmed to be 90% and 55%, respectively.

Example 2

A prepreg consisting of an inner layer a and an outer layer b formed on both sides of the inner layer was prepared in the same manner as in Example 1, except that the inner layer b was formed by using the epoxy resin varnish (II) instead of the epoxy resin varnish (I) in step (d). As a result, the reaction rates for the inner layer a and the outer layer b were confirmed to be 87% and 59%, respectively.

Comparative Example 1

A prepreg having only an inner layer a was prepared, omitting the steps for forming an outer layer b. Specifically, in the steps (a) to (c), the solvent-impregnated glass fabric was passed through the first resin varnish impregnation apparatus 5 containing the epoxy resin varnish (I) to impregnate 100 parts by weight of glass fabric with 110 parts by weight of the resin on a dry basis. The varnish-impregnated glass fabric was dried in a drier at 170° C. for 1.5 minutes to obtain a prepreg. The reaction rate was 62%.

Comparative Example 2

A prepreg was prepared in the same manner as in Comparative Example 1, except that the varnish-impregnated glass fabric was dried in a drier at 170° C. for 3 minutes instead of drying at 170° C. for 1.5 minutes. The reaction rate was 80%.

Comparative Example 3

A prepreg consisting of an inner layer a with a reaction rate of 50% and an outer layer b with a reaction rate of 60% was prepared in the same manner as in Example 1, except for employing appropriately modified heating conditions in the step (c) and step (e).

Comparative Example 4

A prepreg was prepared in the same manner as in Example 1 except that 100 parts by weight of glass fabric was impregnated with 30 parts by weight of the resin on a dry basis in the formation of the inner layer a in the step (b), and 100 parts by weight of glass fabric was impregnated with 80 parts by weight of the resin on a dry basis in the formation of the outer layer b in the step (d). As a result, the reaction rates for the inner layer a and the outer layer b were confirmed to be 81% and 68%, respectively.

Comparative Example 5

A prepreg was prepared in the same manner as in Example 1 except that the glass fabric was used as is without being subjected to a thread opening process. The air permeability of this glass fabric was 60 $cm^3/cm^2/sec$.

Evaluation of Prepreg

A double-sided copper-clad laminated board and a four-layer circuit board were prepared using the prepreg prepared in Examples 1 and 2 and Comparative Examples 1 to 5. The properties of the boards were evaluated. The results are shown in Table 1. In Table 1, fall-off of resin powder is a result of the evaluation of the prepreg before preparing the double-sided copper-clad laminated board and the four-layer circuit board.

A. Preparation of Double-Sided Copper-Clad Laminated Board

A copper foil with a thickness of 18 $\mu$m was layered on both sides of the prepreg, press-formed with heating at a temperature 170° C. for 60 minutes under a pressure of 40 $kgf/cm^2$, to obtain a double-sided copper-clad laminate with an insulating layer thickness of 0.1 mm.

Evaluation of Double-Sided Copper-Clad Laminate

The substrate thickness precision and formability were evaluated on the insulating layer obtained by etching and removing the copper foil from the double-sided copper-clad laminate with a dimension of 500 mm×500 mm. For the determination of substrate thickness precision, the substrate was divided into 36 squares and the thickness was measured at each of the 36 squares. The average of the 36 measurements was taken as the substrate thickness and the standard deviation of the 36 measurements was taken as the substrate thickness precision. The formability was evaluated by inspecting a 500 mm×500 mm board for the presence or absence of voids in a given test circuit area and further inspecting the board for any abnormalities both by the naked eye and by using an optical microscope.

18 μm copper foil peel strength was evaluated according to JIS C6481.

For the evaluation of solder heat resistance, only one side of the prepreg was etched and cut into a 50 mm×50 mm sheet, thereby obtaining three test specimens. Each test specimen was subjected to a moisture absorbing treatment in a pressure cooker at 121° C. under 2.0 atm for two hours. The test specimens were then dipped in a solder bath at 260° C. for 120 seconds, after which they were inspected for the presence of swelling and measles by the naked eye and optical microscope.

For the evaluation of flow-out, a double-sided copper-clad laminate was prepared and the flow-out length (the extruded area) was measured.

B. Preparation OF Four-Layer Circuit Board

An oxidation (blackening) treatment was performed on the surface of a copper foil (thickness: 35 μm) of a double-sided copper-clad laminate with a thickness of 1 mm, as an inner layer circuit board. One sheet of the prepreg was layered on each side of the copper-clad laminate, over which a 18 μm copper foil was layered. The resulting board was press-formed with heating at a temperature of 170° C. for 120 minutes under a pressure of 40 kgf/cm$^2$ to obtain a four-layer circuit board.

Evaluation of the Four-Layer Circuit Board

For the determination of the substrate thickness precision, a 500 mm×500 mm substrate was divided into 36 squares and the thickness was measured for each of the 36 squares. The average of the 36 measurements was taken as the substrate thickness and the standard deviation of the 36 measurements was taken as the substrate thickness precision.

The formability was evaluated by inspecting a 500 mm×500 mm board for the presence or absence of voids in a given test circuit area and further inspecting the board for any abnormalities both by the naked eye and by using an optical microscope.

For the determination of inner layer peel strength, the peel strength at the interface of the inner layer copper foil of this substrate, after the blackening treatment, and the prepreg was measured.

The solder heat resistance was measured in the same manner as in the above-mentioned method of evaluation of the double-sided copper-clad laminate.

For the evaluation of flow-out, a four-layer circuit board was prepared and the flow-out length (the extruded area) was measured.

Fall-out of resin powder was evaluated by the following method.

First, a prepreg is cut to a size of 100 mm×100 mm using a hand cutter taking as much care as possible to minimize resin powder falling out from the cut end. Ten sheets of prepreg thus obtained were stacked and the weight was determined. The stack was then dropped ten times from a height of 100 mm to determine the weight of resin powder falling out by drop impact. The amount of fallen-out resin powder was determined from the weight difference for the sheets of prepreg before dropping and after dropping. Such a measurement was repeated five times to determine the average.

The evaluation of strand voids was carried out as follows. First, a prepreg is cut to a width of 10 cm in the width direction using a hand cutter. The sampling place at this time should be randomly and unintentionally determined. The prepreg is then inspected using an optical microscope (transmission light, 120 times) to count the number of strand voids with a size of 10 μm or greater. The resulting number of strand voids is divided by the sample area to calculate the number of strand voids per unit area. This procedure is performed at three points along the length of the prepreg. The average of the three points is taken as the evaluation point for the strand voids.

TABLE 1

|  | Examples | | Comparative Examples | | | | |
| --- | --- | --- | --- | --- | --- | --- | --- |
|  | 1 | 2 | 1 | 2 | 3 | 4 | 5 |
| Double-sided copper-clad laminated board | | | | | | | |
| Substrate thickness (avg.) mm | 0.153 | 0.154 | 0.152 | 0.158 | 0.154 | 0.154 | 0.156 |
| Substrate thickness precision mm | 0.021 | 0.014 | 0.071 | 0.013 | 0.050 | 0.063 | 0.023 |
| Formability (contact) | No voids | No voids | No voids | Many voids | No voids | Some voids | Many voids |
| Inner-layer peel strength kN/m | 1.43 | 1.51 | 1.41 | 0.51 | 1.45 | 1.42 | 1.42 |
| Solder heat resistance n = 3 | ○○○ | ○○○ | ○○○ | XXX | ○○○ | ○○○ | ○○○ |
| Flow-out mm | 0 | 0 | 7 | 0 | 5 | 3 | 0 |
| Four-layer circuit board | | | | | | | |
| Substrate thickness (avg.) mm | 1.294 | 1.295 | 1.269 | 1.295 | 1.270 | 1.271 | 1.289 |
| Substrate thickness precision mm | 0.023 | 0.015 | 0.105 | 0.018 | 0.069 | 0.075 | 0.024 |
| Formability (contact) | No voids | No voids | No voids | Many voids | No voids | Some voids | Many voids |
| Inner-layer peel strength kN/m | 0.85 | 1.12 | 0.84 | 0.2> | 0.86 | 0.85 | 0.83 |

TABLE 1-continued

|  | Examples | | Comparative Examples | | | | |
| --- | --- | --- | --- | --- | --- | --- | --- |
|  | 1 | 2 | 1 | 2 | 3 | 4 | 5 |
| Solder heat resistance n = 3 | ○○○ | ○○○ | ○○○ | XXX | ○○○ | ○○○ | ○○○ |
| Flow-out mm | 0 | 0 | 10 | 0 | 7 | 5 | 0 |
| Prepreg |  |  |  |  |  |  |  |
| Fallen-out resin powder g | 0.006 | 0.009 | 0.024 | 0.001 | 0.025 | 0.012 | 0.005 |
| Strand void per cm$^2$ | 0 | 0 | 0 | 0 | 0 | 4 | Many |

The prepregs obtained in Examples 1 and 2 exhibit high substrate thickness precision and excellent formability. The product of Comparative Example 1, which is an example of a conventional prepreg, exhibited a substrate thickness precision worse than the prepregs of the Examples. The prepreg of Comparative Example 2 has a surface resin layer in which the reaction has proceeded excessively. The prepreg exhibited good thickness precision, but inferior formability. The prepreg of Comparative Example 3, in which the reaction rate in the inner layer a is lower than the reaction rate in the outer layer b, exhibited substrate thickness precision worse than the prepregs of the Examples. The prepreg of Comparative Example 4, in which the reaction rate in the outer layer b is high and the amount of the resin is large, exhibited substrate thickness precision worse than the prepregs of the Examples. The prepreg of Comparative Example 5, which was made from a glass fiber substrate with insufficient thread opening, contained voids remaining in the inner layer. The voids remained unaltered in the laminate board made from the prepreg. The prepreg also exhibited inferior formability.

INDUSTRIAL APPLICABILITY

The prepreg of the present invention has high thickness precision and is free from production of resin powder by bending and the like, from voids in the cloth in the inner layers, and from flow out. Due to these characteristics the prepreg exhibits excellent formability. This prepreg can be manufactured securely and in a stable manner using the manufacturing process of the present invention.

What is claimed is:

1. A prepreg comprising an inner layer made from a glass fiber substrate, having a weight of from 40 g or more to 115 g or less per square meter and an air permeability of 20 cm$^3$/cm$^2$/sec or less, impregnated with an epoxy resin, and an outer layer of an epoxy resin coating on at least one side of the inner layer, wherein the reaction rate of the epoxy resin in the inner layer is 85% or more and the reaction rate of the epoxy resin in the outer layer is 60% or less.

2. The prepreg according to claim 1, wherein the reaction rate of the epoxy resin in the inner layer is 90 to 95% and the reaction rate of the epoxy resin of the outer layer is 20% or less.

3. The prepreg according to claim 1, wherein the weight ratio (R)/(G) of the epoxy resin (R) and the glass fiber substrate (G) in the inner layer is 0.43 or more.

4. The prepreg according to claim 1, wherein the weight ratio (R)/(G) of the epoxy resin (R) and the glass fiber substrate (G) in the inner layer is 0.53 to 2.40.

5. The prepreg according to claim 1, wherein the glass fiber substrate has a weight of 47 to 105 g per square meter and an air permeability of 5 to 10 cm$^3$/cm$^2$/sec.

6. A multiple-layer circuit board comprising the prepreg according to claim 1 and a copper circuit layer, wherein the prepreg has a weight of epoxy resin per unit area in each outer layer of from grater than A to 1.5A, wherein A is determined by the following formula, and $$A=(1-b/10^2)\times c/10^4\times d \tag{1}$$

wherein A is the weight of the resin per unit area of the outer layer (g/cm$^2$), b is the amount of residual copper (%) in a circuit layer facing the outer layer of the prepreg, c indicates the thickness ($\mu$m) of the circuit copper foil, and d is the specific gravity (g/cm$^3$) of the outer layer resin.

7. The prepreg according to claim 1, wherein the outer layer is present on both sides of the inner layer and the thickness of the outer layers are not identical.

8. A laminated board prepared by forming one or more layered prepregs according to claim 1.

9. The laminated board according to claim 8, which is a multiple-layer board of copper-clad laminate or multiple-layer printed circuit board.

10. A process comprising
   (a) impregnating a glass fiber substrate, having a weight of from 40 g or more to 115 g or less per square meter and an air permeability of 20 cm$^3$/cm$^2$/sec or less, with a solvent,
   (b) impregnating the solvent-impregnated glass fiber substrate with an epoxy resin,
   (c) heating the epoxy resin-impregnated glass fiber substrate to at least partially cured the epoxy resin,
   (d) further impregnating the epoxy resin-impregnated glass fiber substrate, in which the epoxy resin has been at least partially cured, with the same or a different epoxy resin, and
   (e) heating the further impregnated epoxy resin-impregnated glass fiber substrate to form a prepreg comprising an inner layer and an outer layer,
      wherein the reaction rate of the epoxy resin in the inner layer is 85% or more and the reaction rate of the epoxy resin in the outer layer is 60% or less.

11. The process according to claim 10, wherein the reaction rate of the epoxy resin in the inner layer is 90 to 95% and the reaction rate of the epoxy resin in the outer layer is 0 to 20%.

12. The process according to claim 10, wherein the solvent impregnated in the glass fiber substrate in (a) is dimethyl formamide, methyl cellosolve, or methyl ethyl ketone.

13. The process according to claim 10, wherein the solvent is impregnated in the glass fiber substrate in (a) for 0.1 to 1 minute at room temperature.

14. The process according to claim 10, wherein, after (a) and before (b), the solvent-impregnated glass fiber substrate obtained in (a) is passed through an air stream for 1 to 5 minutes at a temperature lower than the boiling point of the solvent used in (a).

15. The process according to claim 14, wherein the amount of solvent present in the solvent-impregnated glass fiber substrate after passing the substrate through an air stream and before (b) is from 16 to 25 parts by weight per 100 parts by weight of the glass fiber substrate.

16. The process according to claim 10, wherein the epoxy resin is impregnated in the glass fiber substrate in (b) for 0.1 to 1 minute at room temperature.

17. The process according to claim 10, wherein (c) includes heating to 140 to 200° C. for 1 to 5 minutes.

18. The process according to claim 10, wherein the epoxy resin is impregnated in the glass fiber substrate in (d) for 0.1 to 1 minute at room temperature.

19. The process according to claim 10, wherein the epoxy resin impregnated glass fiber substrate in (e) is heated from 140 to 200° C. for 1 to 5 minutes.

* * * * *